(12) United States Patent
Zhang et al.

(10) Patent No.: US 10,069,503 B2
(45) Date of Patent: Sep. 4, 2018

(54) METHOD OF SPEEDING UP OUTPUT ALIGNMENT IN A DIGITAL PHASE LOCKED LOOP

(71) Applicant: Microsemi Semiconductor ULC, Kanata (CA)

(72) Inventors: Changhui Cathy Zhang, Ottawa (CA); Qu Gary Jin, Kanata (CA); Mark A. Warriner, Ottawa (CA); Kamran Rahbar, Kanata (CA)

(73) Assignee: Microsemi Semiconductor ULC, Kanata, Ontario (CA)

( * ) Notice: Subject to any disclaimer, the term of this patent is extended or adjusted under 35 U.S.C. 154(b) by 0 days.

(21) Appl. No.: 15/597,726

(22) Filed: May 17, 2017

(65) Prior Publication Data

US 2017/0346494 A1 Nov. 30, 2017

Related U.S. Application Data

(60) Provisional application No. 62/343,048, filed on May 30, 2016.

(51) Int. Cl.
| | |
|---|---|
| H03L 7/06 | (2006.01) |
| H03L 7/10 | (2006.01) |
| H03L 7/18 | (2006.01) |
| H03K 5/135 | (2006.01) |
| H03L 7/099 | (2006.01) |
| H03L 7/091 | (2006.01) |
| H03K 5/00 | (2006.01) |

(52) U.S. Cl.
CPC ............. *H03L 7/103* (2013.01); *H03K 5/135* (2013.01); *H03L 7/091* (2013.01); *H03L 7/0991* (2013.01); *H03L 7/1803* (2013.01); *H03K 2005/00104* (2013.01)

(58) Field of Classification Search
USPC .................................. 327/147–149, 156–159
See application file for complete search history.

(56) References Cited

U.S. PATENT DOCUMENTS

| | | | | |
|---|---|---|---|---|
| 4,423,518 A | * | 12/1983 | Hirosaki | ................ H04L 7/027 327/155 |
| 5,072,173 A | * | 12/1991 | Halder | ................ G01R 21/127 324/141 |
| 5,610,954 A | * | 3/1997 | Miyashita | .............. H03K 5/133 327/157 |

(Continued)

*Primary Examiner* — Adam Houston
(74) *Attorney, Agent, or Firm* — Simon Kahn

(57) ABSTRACT

To speed up output clock alignment in a digital phase locked loop wherein a controlled oscillator generates synthesizer pulses that are divided to produce output pulses at a predetermined normal spacing and time location, and wherein during an alignment procedure the output pulses are moved in time in response to a delay value obtained by comparing a phase of the output pulses with a phase applied to the controlled oscillator averaged over a number of synthesizer pulses in a feedback circuit to align said output pulses with a reference clock taking into account hardware delay, a group of the output pulses is advanced during the alignment procedure to reduce the spacing between them. After determining the delay value averaged over the group of output pulses subsequent output pulses are restored to their normal spacing and time locations.

17 Claims, 5 Drawing Sheets

(56) References Cited

U.S. PATENT DOCUMENTS

| | | | | |
|---|---|---|---|---|
| 5,815,043 A * | 9/1998 | Chow | H03K 3/0315 | 331/108 C |
| 6,236,275 B1 * | 5/2001 | Dent | H03L 7/0898 | 327/106 |
| 6,298,465 B1 * | 10/2001 | Klotchkov | G01R 31/31725 | 327/156 |
| 6,643,345 B1 * | 11/2003 | Inoue | H03L 7/085 | 370/516 |
| 6,721,372 B1 * | 4/2004 | Banik | H03J 1/0058 | 375/344 |
| 6,859,028 B2 * | 2/2005 | Toner | G01R 31/2824 | 324/76.53 |
| 7,046,584 B2 * | 5/2006 | Sorrells | G04F 5/06 | 310/348 |
| 7,414,448 B2 * | 8/2008 | Huang | H03L 7/0812 | 327/159 |
| 7,463,188 B1 * | 12/2008 | McBurney | G01S 19/06 | 342/357.43 |
| 7,642,862 B2 * | 1/2010 | van der Valk | H03L 7/085 | 331/18 |
| 7,656,147 B2 * | 2/2010 | Kim | H03K 5/1565 | 324/76.77 |
| 8,811,915 B2 * | 8/2014 | Bhanji | H04B 1/40 | 370/315 |
| 9,064,396 B2 * | 6/2015 | Patel | H04W 24/08 | |
| 9,444,474 B2 * | 9/2016 | Rahbar | H03L 7/0991 | |
| 9,667,237 B2 * | 5/2017 | Jin | H03L 7/093 | |
| 2011/0156766 A1 * | 6/2011 | Ahn | H03L 7/0814 | 327/142 |
| 2011/0221495 A1 * | 9/2011 | Lee | H03K 5/1565 | 327/158 |
| 2013/0308735 A1 * | 11/2013 | Namdar-Mehdiabadi | H03L 7/1978 | 375/376 |
| 2016/0006441 A1 * | 1/2016 | van der Wagt | H03L 7/0802 | 327/158 |
| 2016/0294401 A1 | 10/2016 | Jin et al. | | |
| 2017/0264304 A1 * | 9/2017 | Dedic | H03L 7/091 | |
| 2017/0346494 A1 * | 11/2017 | Zhang | H03L 7/103 | |
| 2018/0138913 A1 * | 5/2018 | Grouwstra | H03L 7/0802 | |
| 2018/0138915 A1 * | 5/2018 | Jenkins | H03L 7/14 | |

* cited by examiner

METHOD OF SPEEDING UP OUTPUT ALIGNMENT IN A DIGITAL PHASE LOCKED LOOP

CROSS REFERENCE TO RELATED APPLICATION

This application claims the benefit of U.S. provisional application No. 62/343,048, filed May 30, 2016, the contents of which are herein incorporated by reference.

FIELD OF THE INVENTION

This invention relates to the field of phase locked loops, and in particular to a method of speeding up output alignment in a digital phase-locked loop (DPLL).

BACKGROUND OF THE INVENTION

In a prior art DPLL as shown in FIG. 1 the phase of a reference clock ref is sampled and converted to a digital phase value. A software digitally controlled oscillator (SDCO) is locked to the digital phase value. The SDCO controls the output of a hardware digitally controlled oscillator/voltage controlled oscillator (DCO/VCO) such that the frequency and phase of the DCO is synchronized with the SDCO. In this way, the output clock generated by the DCO/VCO is locked to the reference clock ref.

In many applications, it is a requirement that the output clock not only be synchronized to the reference clock, but also that its phase be aligned to the exact time reference. In a DPLL, the phase alignment of DCO/VCO output clock can be achieved by directly controlling the phase of the output clock with SDCO phase value as shown in FIG. 1.

The SDCO can control the DCO phase if both run on the same system clock. If there is any hardware delay in between the DCO and VCO, or in a VCO output pad, or in clock synthesis, such a hardware delay may cause the output clock to lose alignment with the reference clock.

In co-pending application Ser. No. 15/064,663, filed Mar. 9, 2016 and published as US 2016/0294401, the contents of which are herein incorporated by reference, it was shown that the hardware delay can be measured with a feedback path and the resulting delay compensated by adjusting the output clock with a pattern shifter.

The delay can be measured by averaging the phase delay between the sampled feedback output clock and the SDCO internal phase. The measured delay can then be compensated by adjusting the output pattern shifter as shown in FIG. 2. To get a good phase delay measurement, typically 50 to 100 clock samples are required. This can be a problem for a low frequency output. For example, in the case of a 1 Hz clock output, it means that the delay measurement can take 100 s. An even longer time is needed for output frequencies lower than 1 Hz. If the feedback channel is shared with multiple outputs, an even longer waiting time is needed if each output outputs the low frequency clock. Reducing the averaging average time will speed up the alignment procedure but with loss of alignment accuracy.

SUMMARY OF THE INVENTION

Embodiments of the invention describe an architecture and methodology to speed up measurement time for an unknown hardware delay ideal for use when the output frequency is low, for example, in the order of 10 Hz or less. The total required alignment time is much shorter and the alignment precision is not affected.

According to a first aspect of the invention there is provided a method of performing output clock alignment in a digital phase locked loop wherein a controlled oscillator generates synthesizer pulses that are divided to produce output pulses at a predetermined normal spacing and time location, and wherein during an alignment procedure said output pulses are moved in time in response to a delay value obtained by comparing a phase of the output pulses with a phase applied to the controlled oscillator averaged over a number of synthesizer pulses in a feedback circuit to align said output pulses with a reference clock taking into account hardware delay, the method comprising advancing a group of said output pulses during the alignment procedure to reduce the spacing between said output pulses; determining the delay value averaged over said group of output pulses with reduced spacing; generating subsequent output pulses at their normal spacing and time locations; and moving said subsequent output pulses in time by said delay value to compensate for the hardware delay.

In a preferred embodiment the digital phase locked loop is implemented mostly in software. In a preferred embodiment, a software DCO generates frequency and phase information to drive a hardware DCO/VCO. It will be appreciated that the term "circuit" in this context is used in the most general sense to include both software and hardware implementations of a functional module. For example, the "feedback circuit" in practice is implemented entirely in software.

In a preferred embodiment the controlled oscillator drives a plurality of output circuits, which selectively, for example, sequentially, share the feedback circuit to implement the alignment procedure. The reduction in time for alignment achieved by the invention at low frequencies is particularly important in the case of a DPLL with multiple output circuits sharing a common feedback circuit because each output circuit has to wait for the previous output circuit to finish the alignment procedure before it can begin.

According to a second aspect of the invention there is provided a digital phase locked loop comprising a controlled oscillator generating synthesizer pulses; an output circuit dividing said synthesizer pulses to produce output pulses at a predetermined normal spacing and time location; a feedback circuit for moving said output pulses in time in response to a delay value obtained by comparing a phase of the output pulses with a phase applied to the controlled oscillator averaged over a number of synthesizer pulses to align said output pulses with a reference clock taking into account hardware delay during an alignment procedure; and a measurement control module for advancing a group of said output pulses during the alignment procedure to reduce the spacing between said output pulses while compensating for the reduced spacing in the feedback circuit.

BRIEF DESCRIPTION OF THE DRAWINGS

This invention will now be described in more detail, by way of example only, with reference to the accompanying drawings, in which.

DETAILED DESCRIPTION OF PREFERRED EMBODIMENTS

Figure 1:
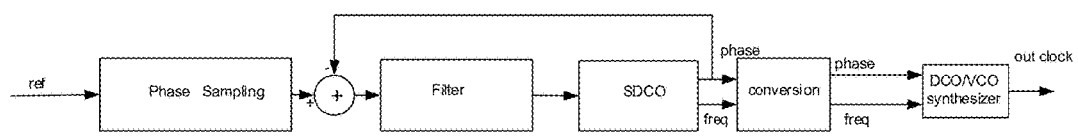
FIG. 1 is a block diagram of a prior art DPLL.
Figure 2:
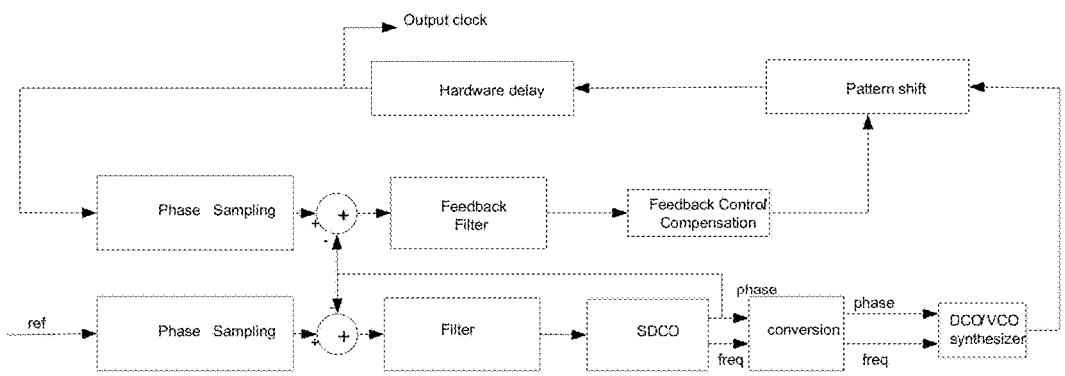
FIG. 2 is a block diagram of a DPLL with alignment feedback control in accordance with co-pending application Ser. No. 15/064,663 referred to above.
Figure 3:
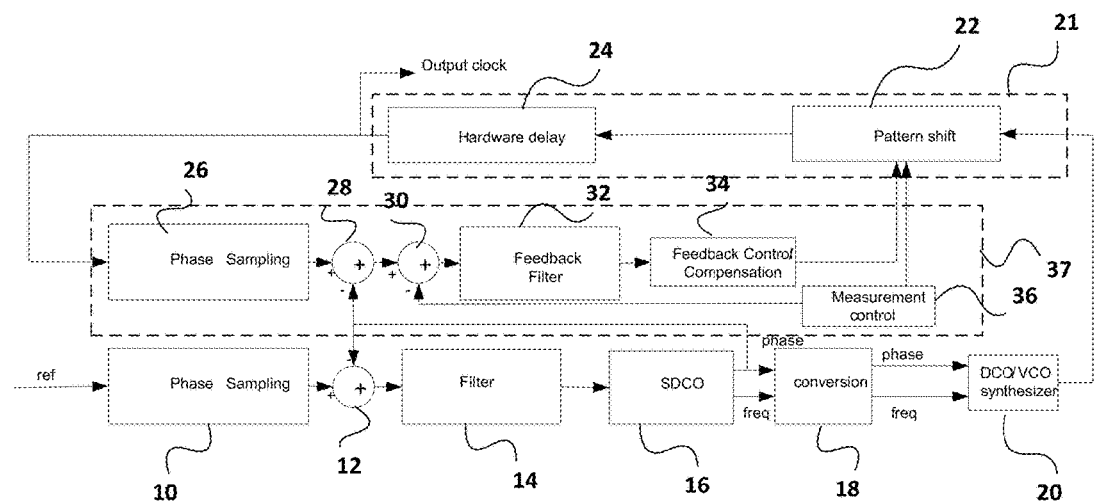
FIG. 3 is a block diagram of a DPLL with alignment feedback control in accordance with an embodiment of the invention.

A DPLL in accordance with an embodiment of the invention is shown in FIG. 3. It will be understood that the circuit is digital is therefore clocked by a master clock (not shown). The DPLL comprises a phase sampling module 10, which samples the phase of a reference clock ref to produce a digital phase value that is input to a first input of phase comparator 12. The phase comparator 12 has a second input receiving a feedback phase value from SDCO 16. The phase comparator 12 outputs a value to loop filter 14, which provides an input to the SDCO 16. The SDCO 16 produces phase and frequency values that are converted in conversion module 18 to phase and frequency inputs to the DCO/VCO synthesizer 20. This could be a numerically controlled oscillator (NCO), for example, in which case the conversion block 18 would output a number representing the frequency, which is the addend of the accumulator, and a number representing phase, which is the number loaded into the accumulator. In the case of a VCO, the outputs of the conversion block 18 are the control voltages for the frequency and phase values.

The DCO/VCO synthesizer 20 supplies an input to an output circuit 21 including pattern shifter 22, which provides the output clock that is subject to a hardware delay represented by the block 24, for example, between the DCO/VCO synthesizer 20 and output pads (not shown).

Figure 5:
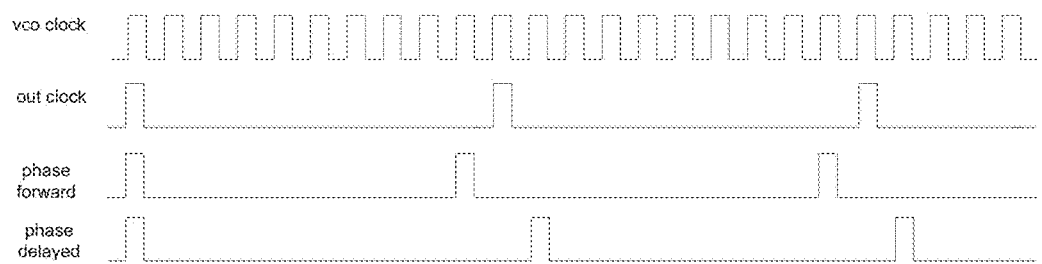
FIG. 5 is a timing chart showing compensating phase movement by adjusting the pattern shifter.

A feedback circuit 37 includes a second phase sampling module 26, which samples the output clock, for example, at the output pads, and compares in comparator 28 the phase of the output clock with the phase value output by the SDCO 16. Ignoring for the moment the effect of subtractor 30 and measurement control module 36, the comparator 28 outputs a value that is passed through feedback filter 32 and feedback control/compensation module 34 to adjust the pattern shifter 22 so as to advance or retard the generated output clock as shown by the timing chart in FIG. 5. The feedback control/compensation module obtains the average delay determined during the alignment procedure and applies it to the pattern shifter 22 as will be described below.

The feedback filter 32 can be a simple averaging filter to remove any noise in the measurement. From the phase difference, the hardware delay can be computed. For example, if the HW delay is 10 nsec, the output clock can be aligned with desired phase requirement by moving output clock by 10 nsec with the resolution precision limited by VCO clock period. The phase movement takes place in increments corresponding to the output pulses of the DCO/VCO synthesizer 20.

So far the operation is as described in co-pending application Ser. No. 15/064,663. As noted above, since 50 to 100 samples are required to get a good estimate of the hardware delay, at low frequencies the averaging procedure can take an unduly long time.

In order to address this problem, embodiments of the present invention include the measurement control module 36 and the additional comparator/subtractor 30 between the comparator 28 and the input to the feedback filter 32.

Figure 6:
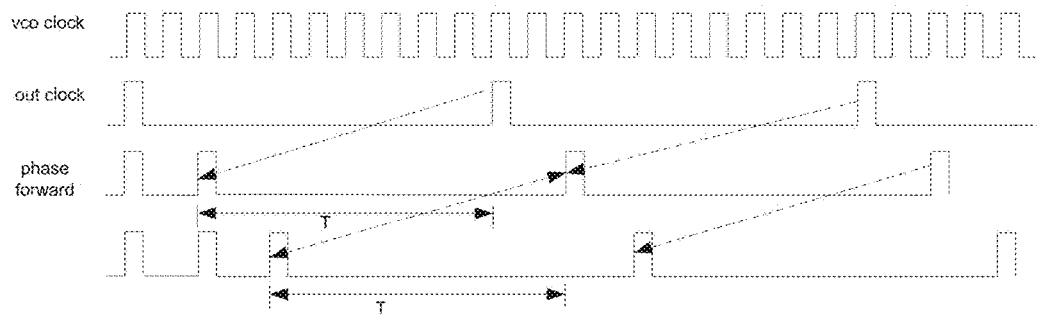
FIG. 6 is a timing chart showing controlled clock edge movement induced by the pattern shifter.

In the example shown in FIG. 6, the pattern shifter 22 produces an output clock pulse for every ten pulses produced by the DCO/VCO synthesizer 20. The measurement control module 36 brings this forward so that an output pulse is produced for every other DCO/VCO synthesizer 20 pulse during the averaging procedure, thereby condensing the amount of time it takes to produce a given number of output pulses. During this averaging procedure the output of the DPLL is disabled by disabling the output pads.

The measurement control module 36 brings forward the first pulse 50 by a time T, the second pulse by a time 2T and so on. The effect is to bunch up the pulses as shown by the fourth line in FIG. 6. For each pulse, the phase comparator will output a hardware delay 6 to which is added the delay T introduced by the measurement control module 36. This delay T is therefore removed by the subtractor 30 before the phase value is input to the feedback filter 32 to leave only the hardware induced component 6. This process is repeated over multiple pulses (e.g. 50 to 100) until a suitable average has been achieved out the output of the feedback filter 32.

At that point the future output pulses are re-aligned to remove the effects of the deliberate delay introduced by the measurement control module 32. The determined hardware delay is then applied to the pattern shifter 22 to move the pulses forward or backward in increments of the DCO/VCO synthesizer 20 pulses as required. As a result the procedure is performed in substantially less time than would be required if the output pulses retained their normal spacing.

Figure 4:
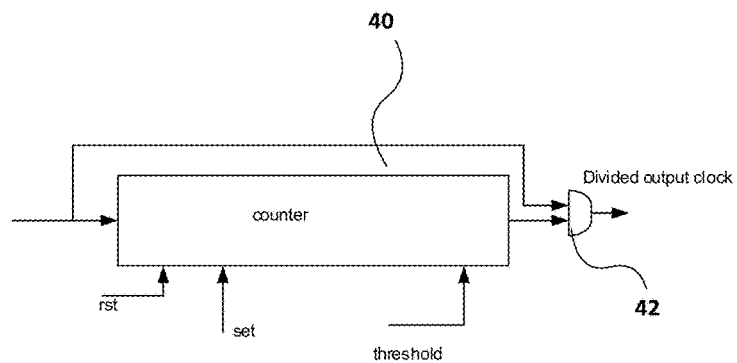
FIG. 4 is a block diagram of a pattern shifter.

In one embodiment, as shown in FIG. 4, the pattern shifter 22 is a cyclic counter 40 having a settable threshold, which determines the spacing between the output pulses relative to the DCO/VCO synthesizer 20 pulses. When the counter 40 reaches the threshold value it is reset to zero and a high is output. The output of the counter 40 is passed through an AND gate 42 receiving the clock pulses from the DCO/VCO synthesizer 20 so that when the counter 40 goes high, a pulse corresponding to a DCO/VCO synthesizer 20 pulse is output. If the threshold is N, the output clock will be generated every N VCO cycles and fvco/N will be the output clock frequency (where fvco is the VCO frequency). By adding a small number to (or subtracting from) the counter, the output clock phase is moved forward (or backward) as shown by the last two lines in FIG. 5. In this example 1 is added to (or subtracted from) the counter 40.

In addition, in accordance with embodiments of the invention, during the alignment procedure the measurement control module 40 adds a positive number to the counter 40 at the moment when the counter reaches 0. Now, the counter starts with a non-zero controlled value T. As a result the next output pulse will be generated early by T, as shown by the third line in FIG. 6.

Figure 7:
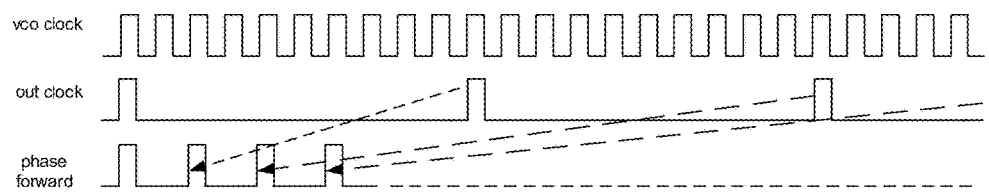
FIG. 7 is a timing chart showing controlled multiple clock edge movements induced by the pattern shifter.

The measurement control module 36 also applies this same value T to the subtractor 30 to remove the value T from the measured delay before it applied to the feedback filter 32. As a result the feedback filter 32 sees the true hardware delay unaffected by the induced delay T. The same procedure can be repeated multiple times as shown in FIG. 7. Multiple delay averages can be accomplished at the output of the feedback filter 32 in a much shorter time. It will be appreciated that although referred to above as pulses, it is the leading edges of the pulses that are moved in time as shown in FIG. 6.

When the alignment procedure is finished, say after 100 pulses, the effects of the introduced delays need to be removed. For example, in the case of a 10 Hz output signal (out clock), the output pulses would normally occur at 0, 100 ms., 200 msec, 300 msec, etc.

Figure 8:
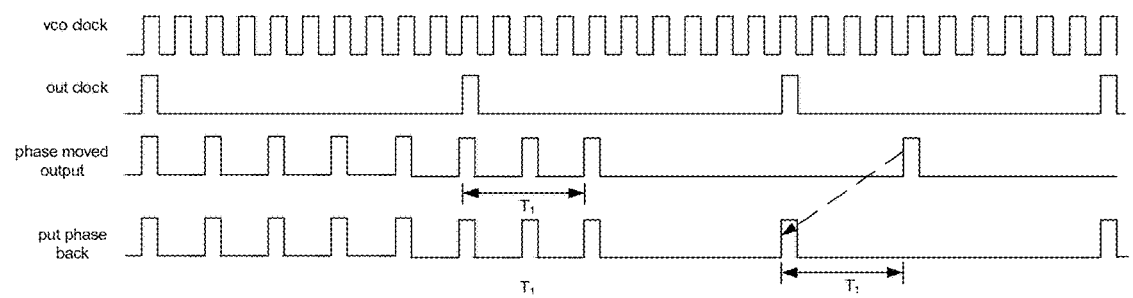
FIG. 8 is a timing chart illustrating the restoration of the I/O alignment after an averaging procedure.

As a result of the alignment procedure with the introduced delay described above, the last clock pulse will now be offset relative to the most recent original clock position by an amount T1 as shown by the last line in FIG. 8. This phase difference is preferably compensated in the next output cycle by adding $T_1$ to the counter 40 of the pattern shifter.

The measurement control module 36 can compute the value $T_1$ as follows. At the end of the averaging procedure, the output clock has been moved by an amount N*T in N movements. It follows therefore that:

$T_1 = N*(T2-T) - T2*\text{fix}(N*(T2-T)/T2)$, where T2 is the output clock period, e.g. 100 ms. for a 10 Hz output clock.

As noted the normal output locations absent any hardware compensation occur at times 0, T2, 2*T2, 3*T2, . . . etc.

But because the clock movement, the actual locations are: N*(T2−T), N*(T2−T)+T2, N*(T2−T)+2*T2, . . . etc.

The measurement control module 36 can be in the form of a software module running on a general processor implementing the DPLL and programmed to add the value T to the counter 40 and subtract T from the output of comparator 28 during the averaging cycle. The measurement control module 36 also disables the output pads during the averaging procedure so that the altered output used during the averaging process is not presented to the outside world.

The processor also computes $T_1$ and removes this value from the counter 40 after the averaging process to restore the output pulses to their normal positions.

Figure 9:
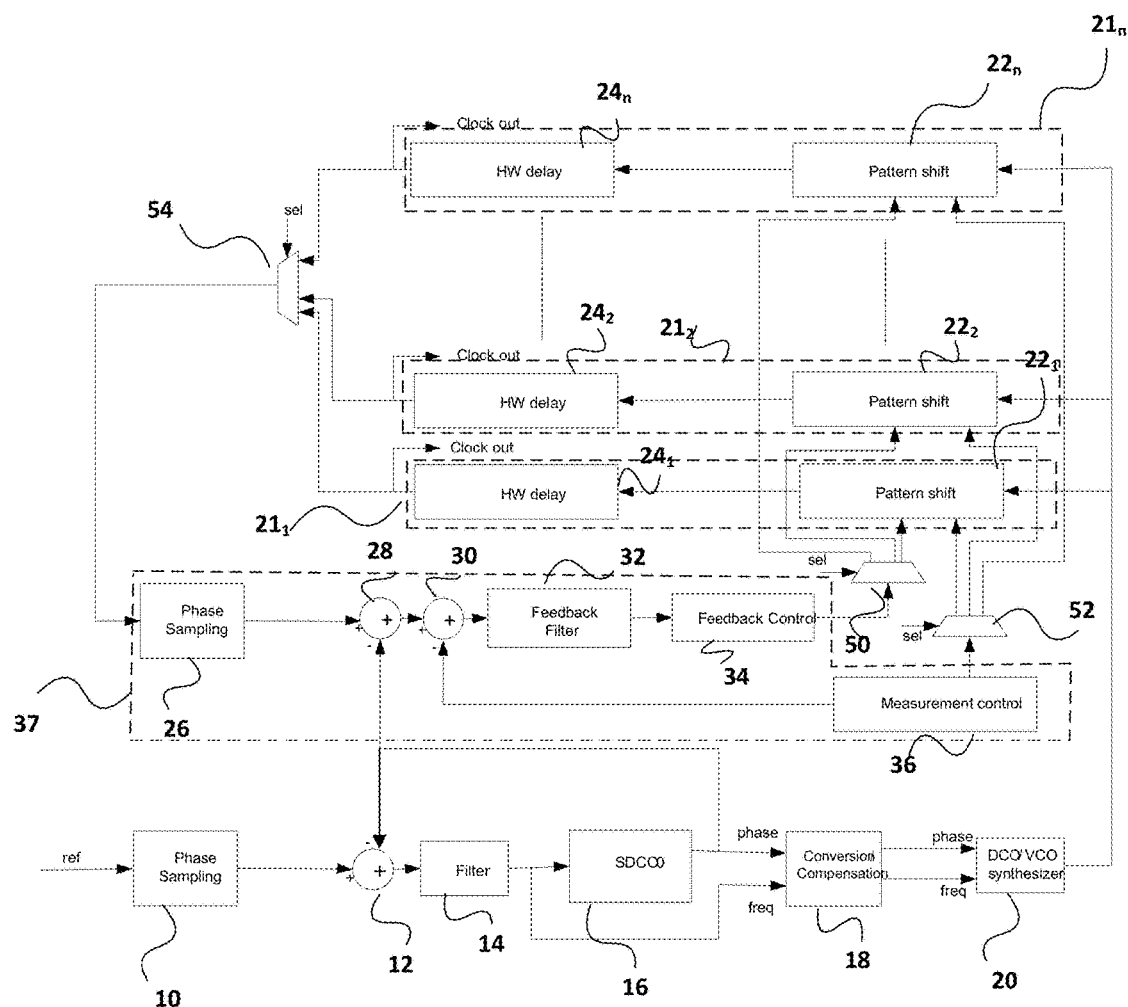
FIG. 9 is a block diagram of a DPLL having multiple outputs with alignment feedback control.

In many applications, it may be required to drive multi clock outputs with different output clock frequencies. In this case, since each output may have different output delays, the feedback delay measurement and compensation has to be timely shared with each individual output. A suitable arrangement is shown in FIG. 9. The DPLL is similar to the one shown in FIG. 3 except the output of the feedback control module 34 is output to multiplexer 50 and the output of the measurement control module 36 is output to multiplexer 52. The respective outputs of each of the multiplexers 50, 52 are connected to pattern shifters $22_1, 22_2 \ldots 22_n$ so that the measurement control module 36 and feedback control module 34 can be selectively applied to the pattern shifters $22_1, 22_2 \ldots 22_n$. Each pattern shifter is connected to corresponding output pads (not shown) associated with a delay indicated by the hardware delay blocks $24_1, 24_2 \ldots 24_n$. The active output is selected by multiplexer 54 and applied to the phase sampler 26. The select inputs of the multiplexers 50, 52, 54 are controlled by a control module not shown. When a particular pattern shifter $22_1, 22_2 \ldots 22_n$ is active, the arrangement works in a similar manner for the active pattern shifter as the arrangement described with reference to FIG. 3. Each pattern shifter can be activated in turn in a round robin fashion so that the pattern shifters share the single feedback channel to effect I/O alignment.

The examples given above are concerned with a clock pulse output where the leading edge of the pulses acts as the reference and is moved in time. The invention is also applicable to a clock output wherein both the leading and trailing edges are moved in time using the same methodology to reduce the measurement time.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A method of performing output clock alignment in a digital phase locked loop wherein a controlled oscillator generates synthesizer pulses that are divided to produce output pulses at a predetermined normal spacing and time location, and wherein during an alignment procedure said output pulses are moved in time in response to a delay value obtained by comparing a phase of the output pulses with a phase applied to the controlled oscillator averaged over a number of synthesizer pulses in a feedback circuit to align said output pulses with a reference clock taking into account hardware delay, the method comprising:
   advancing a group of said output pulses during the alignment procedure to reduce the spacing between said output pulses;
   determining the delay value averaged over said group of output pulses with reduced spacing;
   generating subsequent output pulses at their normal spacing and time locations; and
   moving said subsequent output pulses in time by said delay value to compensate for the hardware delay.

2. The method as claimed in claim 1, wherein a first of said group of output pulses is advanced by a time T, a second of said group of pulses is advanced by 2*T and so on to reduce the spacing between said output pulses during said alignment procedure to T2−T, where T2 is the normal spacing between said output pulses.

3. The method as claimed in claim 2, wherein said output pulses are generated by a cyclic counter in a pattern shifter reaching a threshold value, and wherein said pulses are advanced during said alignment procedure by seeding said counter with a non-zero positive value.

4. The method as claimed in claim 3, wherein said time T is subtracted from the comparison of the phase value of the output pulses with the phase applied to the controlled oscillator to eliminate the effect of advancing said output pulses.

5. The method as claimed in claim 1, wherein the synthesizer pulses from the controlled oscillator are directed to a plurality of output circuits generating a plurality of streams of output pulses, and wherein said alignment procedure is applied selectively to each of said output circuits.

6. The method as claimed in claim 5, said output circuits are selected for said alignment procedure by coupling said feedback circuit selectively to said output circuits with multiplexers, and wherein the output of a selected output circuit subject to hardware delay is coupled through a multiplexer to an input of the feedback circuit.

7. The method as claimed in claim 6, wherein each said output circuit comprises a pattern shifter generating said streams of output pulses, each said pattern shifter generating said pulses when a cyclic counter reaches a threshold value, and wherein said pulses are advanced during said alignment procedure by seeding said counter with a non-zero positive value.

8. The method as claimed in claim 1, wherein said controlled oscillator is controlled by phase and frequency values generated by a software DCO (SDCO).

9. A digital phase locked loop comprising:
a controlled oscillator generating synthesizer pulses;
an output circuit dividing said synthesizer pulses to produce output pulses at a predetermined normal spacing and time location;
a feedback circuit for moving said output pulses in time in response to a delay value obtained by comparing a phase of the output pulses with a phase applied to the controlled oscillator averaged over a number of synthesizer pulses to align said output pulses with a reference clock taking into account hardware delay during an alignment procedure; and
a measurement control module for advancing a group of said output pulses during the alignment procedure to reduce the spacing between said output pulses while compensating for the reduced spacing in the feedback circuit.

10. The digital phase locked loop as claimed in claim 9, wherein said measurement control module is configured to advance a first of said group of output pulses by a time T, a second of said group of pulses by 2*T and so on to reduce the spacing between said output pulses during said alignment procedure to T2−T, where T2 is the normal spacing between said output pulses.

11. The digital phase locked loop as claimed in claim 10, wherein said output circuit comprises a pattern shifter generating said output pulses by a cyclic counter reaching a threshold value, and said measurement control module is configured to seed said cyclic counter during said alignment procedure with a non-zero positive value.

12. The digital phase locked loop as claimed in claim 11, wherein said feedback circuit comprises a phase comparator for comparing the phase the output pulses with the phase applied to the controlled oscillator, and a subtractor for subtracting said time T from the output of said phase comparator to eliminate the effect of advancing said output pulses during the alignment procedure.

13. The digital phase locked loop as claimed in claim 12, wherein said measurement control module is configured compute the time displacement $T_1$ of the last of said group of pulses relative to the notional position of the most recent output pulse that would have occurred without the advance induced by the measurement control module, and to advance the next output pulse by the computed mount to restore the output pulses to the positions that would have occupied in the absence of the advance induced by the measurement control module.

14. The digital phase locked loop as claimed in claim 13, wherein the measurement control module computes the value $T_1=N*(T2-T)-T2*\text{fix}(N*(T2-T)/T2)$, where T2 is the output clock period and N is the number of pulses advanced by the measurement control module.

15. The digital phase locked loop as claimed in claim 9, further comprising a plurality of output circuits coupled to said controlled oscillator for generating a plurality of streams of output pulses, and multiplexers for selectively coupling said feedback circuit to said output circuits to apply said alignment procedure thereto.

16. The digital phase locked loop as claimed in claim 15, wherein each said output circuit comprises a pattern shifter generating said streams of output pulses, each said pattern shifter generating said pulses when a cyclic counter reaches a threshold value, and wherein said measurement control module is configured to seed said cyclic counter with a non-zero positive value to advance said output pulses.

17. The digital phase locked loop as claimed in claim 15, further comprising a software DCO generating phase and frequency values controlling said controlled oscillator.

* * * * *